US008184820B2

(12) United States Patent
Abe et al.

(10) Patent No.: US 8,184,820 B2

(45) **Date of Patent: *May 22, 2012**

(54) INDIRECT ACOUSTIC TRANSFER CONTROL OF NOISE

(75) Inventors: Takeshi Abe, Garden City, MI (US); Robert G. Rebandt, II, Wayne, MI (US); Ming-te Cheng, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1383 days.

This patent is subject to a terminal disclaimer.

(21) Appl. No.: 11/638,829

(22) Filed: Dec. 14, 2006

(65) Prior Publication Data

US 2008/0144850 A1 Jun. 19, 2008

(51) Int. Cl.
*G10K 11/16* (2006.01)
*H03B 29/00* (2006.01)

(52) U.S. Cl. ..................... 381/71.4; 381/71.1; 381/71.3; 381/86; 181/148; 181/206; 181/293; 181/295; 181/296

(58) Field of Classification Search ................. 381/71.1, 381/71.3, 71.4, 86; 181/206, 293, 199, 148, 181/295, 296

See application file for complete search history.

(56) References Cited

U.S. PATENT DOCUMENTS

| | | | | |
|---|---|---|---|---|
| 4,506,380 | A | 3/1985 | Matsui | 381/71 |
| 4,574,915 | A | 3/1986 | Gahlaii | 181/290 |
| 5,094,318 | A | 3/1992 | Maeda | 181/290 |
| 5,131,047 | A | 7/1992 | Hashimoto | 381/71 |
| 5,321,759 | A | 6/1994 | Yuan | 381/71 |
| 5,386,372 | A * | 1/1995 | Kobayashi et al. | 700/280 |
| 5,554,831 | A | 9/1996 | Matsukawa | 181/294 |
| 5,817,408 | A | 10/1998 | Orimo | 428/218 |
| 6,102,465 | A | 8/2000 | Nemoto | 296/36.3 |
| 6,305,294 | B1 | 10/2001 | Hashino | 104/91 |
| 6,343,127 | B1 * | 1/2002 | Billoud | 381/71.4 |
| 6,554,101 | B2 | 4/2003 | Watanabe | 181/290 |
| 6,589,643 | B2 | 7/2003 | Okada | 428/297.4 |
| 6,767,050 | B2 | 7/2004 | Junker | 296/193.02 |
| 7,017,250 | B2 | 3/2006 | Gebreselassie | 29/428 |
| 7,070,848 | B2 | 7/2006 | Campbell | 428/137 |
| 2004/0130081 | A1 | 7/2004 | Hein | 267/140.14 |
| 2004/0240678 | A1 | 12/2004 | Nakamura | 381/71.11 |
| 2005/0150720 | A1 * | 7/2005 | Tudor et al. | 181/286 |

* cited by examiner

*Primary Examiner* — Vivian Chin
*Assistant Examiner* — Paul Kim
(74) *Attorney, Agent, or Firm* — Gregory P. Brown, Esq.; MacMillan, Sobanski & Todd, LLC

(57) ABSTRACT

A noise control system is directed to the path along which the noise is transmitted from the source of the noise being generated to the receiver of the noise in the passenger compartment of an automotive vehicle. The noise control system is deployed in a box structure, such as the dual bulkhead of the dashboard of the vehicle, to provide a constrained volume within which engine noise can be controlled. The dual bulkhead plenum houses an active noise control apparatus, such as a speaker or a vibrating device, between the bulkheads to be operable with a control algorithm to generate sound that can control the noise or vibrations generated by the engine. The plenum can also be treated with passive noise control materials, such as viscoelastic damping materials, acoustical foam or heavy vinyl barrier and foam to block airborne sound and vibrations, in addition to the active noise control.

17 Claims, 2 Drawing Sheets

Fig. 1
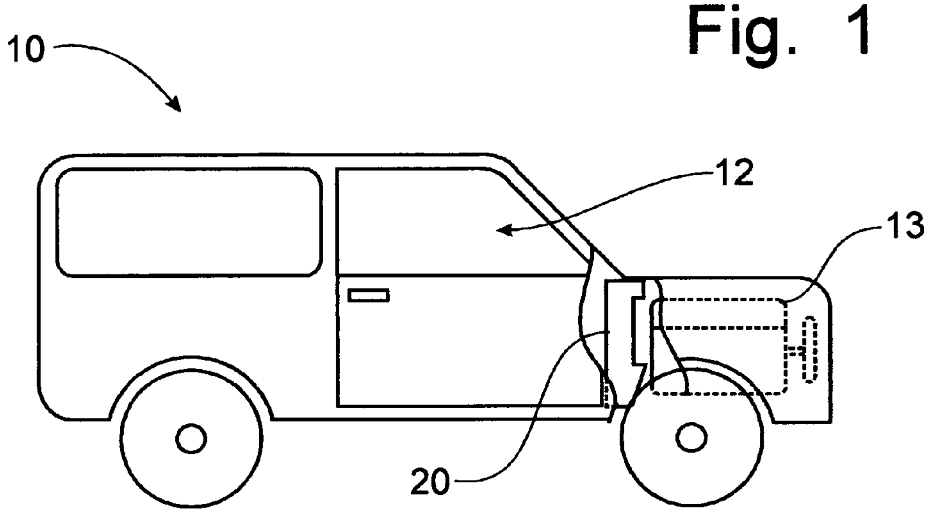
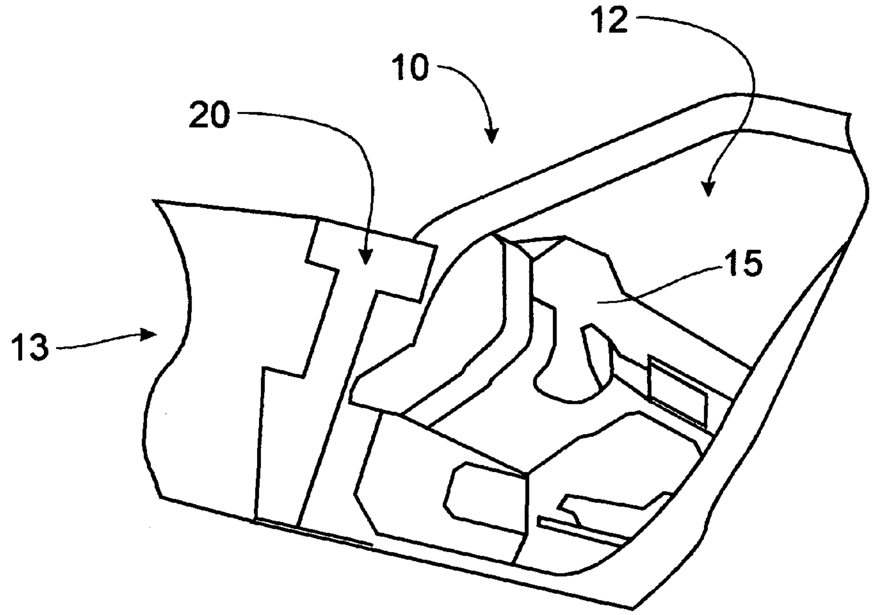
Fig. 2

Fig. 3
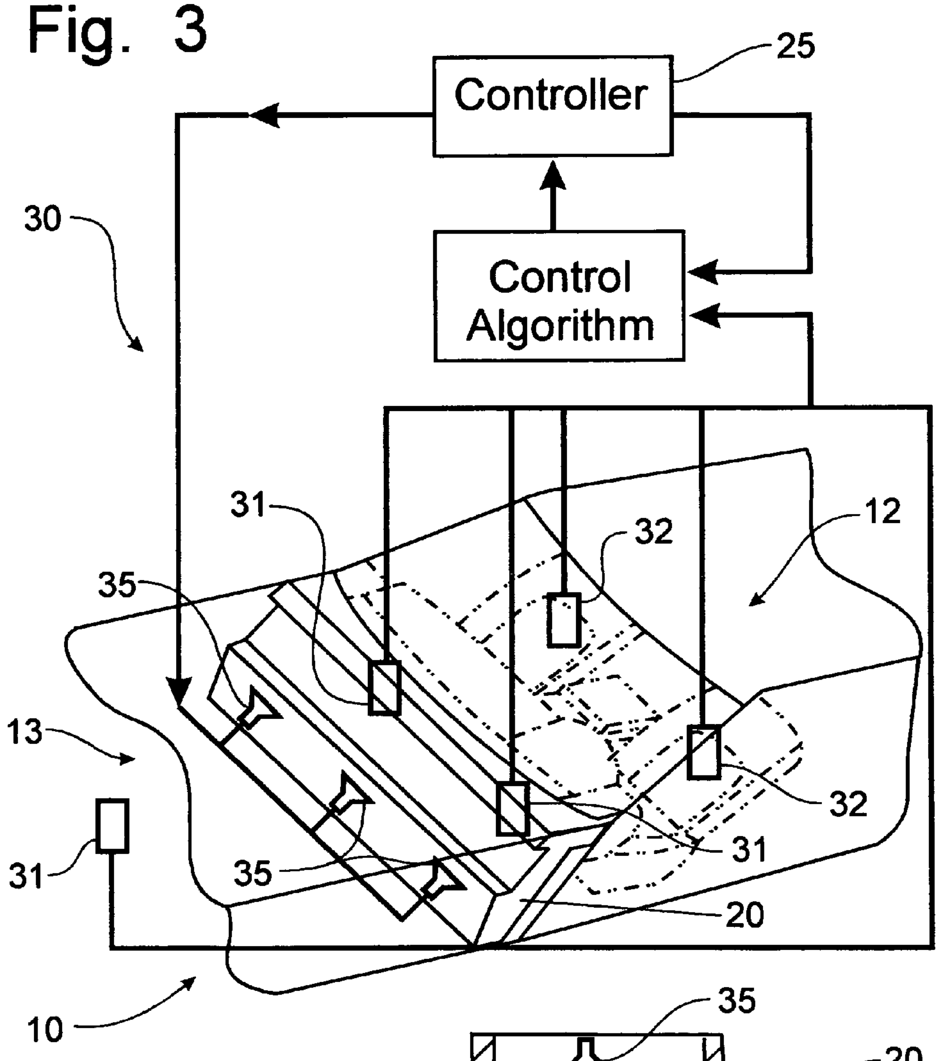
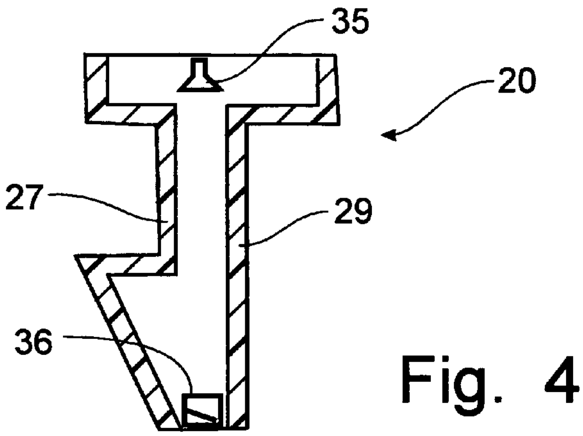
Fig. 4

INDIRECT ACOUSTIC TRANSFER CONTROL OF NOISE

FIELD OF THE INVENTION

This invention relates generally to the control the noise generated by an automotive vehicle and, more particularly, to the reduction of noise in the passenger compartment of an automotive vehicle by controlling the transmission of the noise along the acoustic transfer path from the source of the noise to the receiver of the noise.

BACKGROUND OF THE INVENTION

The operation of the powertrain in an automobile is one of the major contributors of noise received within the passenger compartment of the automobile. With new powertrain technology, such as electronic valve actuation and variable displacement engine, new methods are needed to control the interior noise. In order to improve customer perceived interior noise quality, passenger compartment active noise control has been a popular strategy for study. Such methods of noise control are discussed below relative to prior art documents. Generally, these methods are expensive and only control the receiving end of the problem such as the passenger driver's ear positions, which can affect the speech intelligence to the passenger. Other methods of controlling noise are directed to the source, such as an active control of the induction or exhaust systems, have been developed. However, active control capability is limited and is very complex and expensive. Therefore, active noise control systems have not proven to be popular even though the methodology and technical capability have existed for many years.

An example of active passenger cabin sound suppression technology can be found in U.S. Pat. No. 4,506,380 granted to Shinichi Matsui on Mar. 19, 1985, in which speakers disposed in the dash panel of the vehicle are individually energized to selectively control the resonance occurred with respect to engine vibration. Similarly, an active vibration/noise control system in taught in U.S. Pat. No. 5,386,372, issued on Jan. 31, 1995, to Toshiski Kobayashi, et al, wherein speakers are arranged in suitable locations in the dashboard of the passenger compartment to control the noise from the engine. Self-expanding engine mounts have actuators formed of piezo-electric elements or magnetostrictive elements to prevent the vibrations from being transmitted from the engine.

Passive sound-absorbing materials are utilized throughout an automotive vehicle to reduce noise transmission. An example is found in U.S. Pat. No. 7,017,250, issued to Girma Gebreselassie, et al, on Mar. 28, 2006, wherein a dash insulator system has a substrate made from foam that is used to absorb the sound directed to a dash insulator. In U.S. Pat. No. 4,574,915, granted to Heinemann Gahlaii, et al on Mar. 11, 1986, sound-insulating cladding, formed from viscoelastic foam material is secured on the face of the front bulkhead to provide a sound-insulated area. Sound absorbing materials are used in the dashboard area of the vehicle to provide a passive noise control system preventing the noise generated in the engine compartment from being transmitted to the passenger compartment, as is suggested in U.S. Pat. No. 5,094,318, granted to Takashi Maeda, et al on Mar. 10, 1992; in U.S. Pat. No. 5,554,831, granted to Hiroshi Matsukawa, et al on Sep. 10, 1996; in U.S. Pat. No. 5,817,408, granted to Motohiro Orimo, et al on Oct. 6, 1998; in U.S. Pat. No. 6,102,465, granted to Kouichi Nemoto on Aug. 15, 2000; and in U.S. Pat. No. 6,554,101 granted to Kyoichi Watanabe on Apr. 29, 2003.

An isolator system, comprised of cast foam, is affixed to horizontal and vertical portions of the vehicle dash panel to reduce the transmission of unwanted noise and vibration from the engine compartment is taught in U.S. Pat. No. 6,767,050 granted to Christian Junker on Jul. 27, 2004, and assigned to Ford Global Technologies, LLC, and in U.S. Pat. No. 7,070, 848 granted to Michael Campbell on Jul. 4, 2006. An automotive dash insulator system, used to reduce noise transmission from the engine to the interior of the vehicle, is formed with a sound-absorbing layer comprised of a viscoelastic foam as depicted in U.S. Patent Application Publication No. 2005/0150720, of Jay Tudor, et al, published on Jul. 14, 2005.

A noise control system using a piezo-electric control scheme can be found in U.S. Pat. No. 6,589,643, granted on Jul. 8, 2003, to Jun Okada, et al, in which sound absorbing material, such as piezo-electric material, is used to insulate a dashboard in a vehicle to absorb and prevent the entry of low-frequency noise from the engine into the passenger compartment. In U.S. Patent Application Publication No. 2004/0130081 of David Hein, published on Jul. 8, 2004, a piezo-electric actuator and sensor assemblies are introduced between various structures contained within the instrument panel to minimize vibration within the instrument panel structure.

Adaptive filters have also been used to control noise generated from a noise source, such as the engine in an automobile, as taught in U.S. Pat. No. 5,131,047, issued to Hiroyuki Hashimoto, et al on Jul. 14, 1992, where a speaker is utilized to reproduce engine noise that cancels the generated engine noise. In U.S. Pat. No. 5,321,759, granted to Yi Yuan on Jun. 14, 1994, adaptive filters having transversal filters are utilized in an active noise control system to cancel engine generated vibrational noise. A directional microphone is integrated into the dashboard to achieve a directional effect for controlling automotive noise is taught in U.S. Pat. No. 6,305,732, granted on Oct. 23, 2001, to Hans-Wilheim Ruhl. In U.S. Pat. No. 6,324,294, issued on Nov. 27, 2001 to Henry Azima, et al, loud speaker panels are attached to or installed in the dashboard of an automobile. U.S. Patent Application Publication No. 2004/0240678 ofYoshio Nakamura, et al, published Dec. 2, 2004, discloses an active noise control system that uses a speaker to control problematic noise generated by the engine.

It would be desirable to provide a system for reducing engine noise that is directed to the transfer path, rather than the source or the receiver of the noise.

SUMMARY OF THE INVENTION

It is an object of this invention to overcome the aforementioned disadvantages of the known prior art by providing a noise control system that is directed to the transfer path of the noise transmission.

It is another object of this invention to provide an active control system for noise generated at the engine that is deployed within the dual bulkhead plenum of an automotive dashboard.

It is a feature of this invention that the dual bulkhead plenum in the vehicle dashboard is located along the transfer path along which engine noise is transmitted into the passenger compartment.

It is an advantage of this invention that utilization of sound control techniques within the dual bulkhead plenum is directed to the transmission of the noise, as opposed to being directed to the source or receiver of the noise.

It is another advantage of this invention that the active acoustic transfer function provides an efficient control of the noise transmitted to the cabin of the automotive vehicle through the dash panel.

It is another feature of this invention that the constrained volume of the dual bulkhead plenum helps to provide a more efficient noise control system.

It is still another advantage of this invention that the deployment of simple hardware or software systems can provide a low cost and high capability active noise control within the dual bulkhead plenum of the vehicle dashboard to affect noise within the passenger compartment.

It is still another object of this invention to reduce the transmission of engine noise into the passenger compartment of an automotive vehicle by interrupting the transfer path of the noise transmission.

It is still another feature of this invention to provide an active noise control within the dual bulkhead of an automotive dashboard.

It is yet another feature of this invention to utilize speakers within the dual bulkhead plenum to control engine noise being transmitted through the plenum.

It is yet another advantage of this invention that the plenum can be damped with sound absorbing acoustic materials attached to the surface of the sheet metal forming the bulkhead.

It is a further feature of this invention that the dual bulkhead plenum can be broken into chambers into which separate noise attenuation devices can be positioned.

It is another feature of this invention that the level of noise control can be varied from chamber to chamber.

It is a further advantage of this invention that the noise control system is placed in a less harsh environment than being utilized at the source of the noise.

It is still a further advantage of this invention that the noise control system can be adapted to any automotive vehicle utilizing a dual bulkhead instrument dash panel design.

It is yet another object of this invention to provide a noise control system directed to the transmission transfer path of the noise, which is durable in construction, inexpensive of manufacture, carefree of maintenance, facile in assemblage, and simple and effective in use.

These and other objects, features and advantages are accomplished according to the instant invention by providing a noise control system directed to the path along which the noise is being transmitted from the source of the noise being generated to the receiver of the noise in the passenger compartment of an automotive vehicle. The noise control system is deployed in a box structure, such as the dual bulkhead of the dashboard of the vehicle, to provide a constrained volume within which engine noise can be controlled. The dual bulkhead plenum houses an active noise control apparatus, such as a speaker or a vibrating device, between the bulkheads to be operable with a control algorithm to generate sound that can control the noise or vibrations generated by the engine. The plenum can also be treated with passive noise control materials, such as viscoelastic damping materials, acoustical foam or heavy vinyl barrier and foam to block airborne sound and vibrations, in addition to the active noise control.

BRIEF DESCRIPTION OF THE DRAWINGS

The advantages of this invention will become apparent upon consideration of the following detailed disclosure of the invention, especially when taken in conjunction with the accompanying drawings wherein:

FIG. 1 is a partial schematic side elevational view of an automotive vehicle having a noise control system incorporating the principles of the instant invention;

FIG. 2 is a partial schematic perspective view of an automotive vehicle having a dual bulkhead plenum into which the noise control system is deployed to control the transmission of engine noise into the passenger compartment;

FIG. 3 is a diagrammatic view of the active noise control system utilizing speakers mounted in the dual bulkhead plenum of the automotive instrumentation panel; and FIG. 4 is a schematic side elevational view of the dual bulkhead plenum to depict the application of acoustic material within the plenum.

DETAILED DESCRIPTION OF THE PREFERRED EMBODIMENT

Referring to FIGS. 1-4, an automotive vehicle incorporating the principles of the instant invention can best be seen. The control of undesirable noise intruding into the passenger compartment of an automobile has been the subject of recent development. Some noise control systems take the approach of countering the sound waves after they enter the passenger compartment, such as by introducing opposing sound waves via speakers appropriately arranged within the passenger compartment. Other noise control systems take the approach of countering the sound waves at the point of generation, such as by introducing opposing sound waves by speakers located appropriately within and/or around the engine, such as a speaker positioned at the air intake for the engine. The instant invention takes a unique approach to the control of noise by countering the sound waves along the transfer path of the noise, as opposed to at the receiver or at the generator.

To control acoustic transfer functions between the source, e.g. the engine 13, and the receiver, e.g. the passenger cabin 12 of the automobile 10, a box-like structure, which is defined with respect to the instant application as being a structure having a fixed volume, is placed along the transfer path between the generator and receiver. In some automotive vehicles 10, the instrument panel 15 is provided with a dual bulkhead plenum 20 located between the engine 13 and the passenger compartment 12. The dual bulkhead plenum 20 provides a suitable box-like structure for controlling the transfer of sound waves or vibrations along the transfer path through the instrument panel 15 in to the passenger compartment 12. Due to the lower level of sound or vibrational energy passing through the plenum 20 and the constrained volume of the plenum 20, very low cost, yet high capability, active noise control system can be utilized within the plenum 20 utilizing relatively simple hardware and software systems.

The noise control system 30 can include sensors 31 within the engine compartment to identify the frequency and amplitude of the sound energy being produced by the engine 13 for transfer to the passenger compartment 12 through the dual bulkhead plenum 20, and sensors 32 within the passenger compartment 12 to identify the frequency and amplitude of the sound energy being transmitted into the passenger compartment 12. These sensors can be utilized in an open loop control system with a control algorithm that can result in the production of a countering sound wave introduced by speakers 35 within the plenum 20.

Preferably, the control system is a closed loop system in which the sensors 31, 32 are used to detect operational parameters for the vehicle, such as speed of operation, ambient temperature, weather conditions, RPM level of the engine, etc. The controller 25 employs a mathematical model of the vehicle's acoustic response to these environmental conditions through a control algorithm and generates a countering sound wave in response to the predicted sound energy level.

Accordingly, speakers 35 are placed within the plenum 20 to introduce the countering sound energy to control the sound waves being transmitted along the transfer path through the plenum 20. Vibrational energy can also be countered by opposing counteractive vibrational energy, which can be induced into the plenum 20 by a vibrator 36, schematically depicted in FIG. 4, that generates a vibration in the walls of the plenum that has an opposite amplitude and frequency to the vibrations emanating from the engine 13 or other vehicle component and being transmitted through the plenum 20. As an alternative to providing opposing amplitude and frequency to the sound and/or vibrations passing through the plenum 20, the speakers 35 and/or vibrators 36 can shape the sound being transmitted through the plenum 20 by providing partially opposing amplitude and frequency, thus allowing predetermined sounds or vibrations to reach the passenger compartment.

Alternatively, or as an optional addition to the speakers 35 and or vibrators 36, the plenum 20 can be lined with acoustic materials 27, 29, as are depicted in FIG. 4. Examples of this passive approach to sound management are acoustic damping materials, such as a damping sheet with a viscoelastic surface to provide a high damping over broad temperatures and frequency ranges. Acoustic absorption materials, such as acoustic foam 29, can provide maximum sound absorption with minimal thickness layers of foam applies to the surface of the sheet metal of the plenum 20 to reduce reverberation. Acoustic barrier materials, such as a heavy vinyl barrier 27 to block airborne sound with foam to reduce impact noise, provide maximum sound attenuation with high transmission loss. Coupling the passive acoustic materials with the active sound control system 30 can provide a highly capable noise control system, as is reflected in FIG. 4.

It will be understood that changes in the details, materials, steps and arrangements of parts which have been described and illustrated to explain the nature of the invention will occur to and may be made by those skilled in the art upon a reading of this disclosure within the principles and scope of the invention. The foregoing description illustrates the preferred embodiment of the invention; however, concepts, as based upon the description, may be employed in other embodiments without departing from the scope of the invention.

For example, this noise control technology can be adapted and expanded for use in other vehicle structures, such as the wheel fender and trunk, wherever a fixed volume can be realized within the confines of the vehicle structure. Other applications of this noise control technology would include construction equipment, and other heavy equipment, the aerospace industry, and the heating, ventilation and air conditioning industry.

Having thus described the invention, what is claimed is:

1. An automotive vehicle, comprising:

a chassis defining an engine compartment and a longitudinally spaced passenger compartment;

an engine mounted in said engine compartment and being operable to generate noise energy;

a transverse dual bulkhead plenum located at a forward position in said passenger compartment and being interposed between said engine compartment and said passenger compartment within the transfer path of the noise energy being transmitted from said engine to said passenger compartment so that the noise energy passes through the plenum to reach the passenger compartment; and a noise control system placed within said plenum to control the transfer of said noise energy through said plenum into said passenger compartment, wherein said noise control system includes sensors supported on said vehicle to sense operational conditions relating to said engine, said noise control system further including a device mounted in said plenum to generate counter noise to counteract said noise energy.

2. The automotive vehicle of claim 1 wherein said noise energy is in the form of sound waves, and wherein said device includes speakers mounted in said plenum.

3. The automotive vehicle of claim 2 wherein said plenum includes passive sound control materials affixed to walls defining said plenum.

4. The automotive vehicle of claim 2 wherein said sensors are positioned in said vehicle to sense the frequency and amplitude of said sound waves generated by said engine and output a signal indicative of said sound waves.

5. The automotive vehicle of claim 4 wherein said noise control system also includes a controller operable to receive said signals from said sensors and to generate therefrom counter sound waves for the sensed engine sound waves by said speakers in said plenum.

6. The automotive vehicle of claim 1 wherein said sensors are positioned in said vehicle to sense the frequency and amplitude of said vibrational energy generated by said engine and output a signal indicative of said engine vibrational energy.

7. The automotive vehicle of claim 6 wherein said device includes a vibration generator mounted in said plenum to create a counter vibrational energy in said plenum, and a controller operable to receive said signals from said sensors and generate therefrom said counter vibrational energy for the sensed engine vibrational energy by said vibration generator in said plenum.

8. A noise control system operable with a noise generating apparatus producing noise energy and a compartment for containing a person located remotely from the noise generating apparatus to receive said noise energy, comprising:

a box-like plenum located along a transfer path extending longitudinally between said noise generating apparatus and said compartment such that said noise energy passes through said plenum to reach said compartment;

a counter energy generating device mounted within said box-like plenum;

at least one sensor to sense operational parameters of said noise energy; and a controller operable to receive a signal from said at least one sensor, develop a noise control signal and send said noise control signal to said at least one counter energy generating device to create a counter noise energy to provide cancellation of said noise energy within said box-like plenum so that noise energy reaching the compartment is reduced.

9. The noise control system of claim 8 wherein said noise energy is in the form of a generated sound wave having operational parameters including an amplitude and a frequency, said counter energy generating device being a speaker, said controller sending a signal to said speaker to generate a counter sound wave having a frequency and amplitude opposite to the corresponding amplitude and frequency of said generated sound wave to counteract said generated sound wave.

10. The noise control system of claim 9 wherein said box-like plenum includes passive sound control materials affixed to walls defining said box-like plenum.

11. The noise control system of claim 10 wherein said box-like plenum includes a pair of longitudinally spaced bulkheads and is connected to an instrument panel in an automotive vehicle located at a forward position in a passenger compartment of said vehicle.

12. The noise control system of claim 11 wherein said at least one sensor is operable to sense an operational environmental condition of the vehicle, said at least one sensor being positioned to sense the frequency and amplitude of generated vibrational energy created by said noise generating apparatus, said counter energy generating device also including a vibration generator mounted in said plenum to create a counter vibrational energy in said plenum to counteract the generated vibrational energy.

13. A method of controlling a transmission of noise energy from a noise generating apparatus producing generated noise energy and a compartment for containing a person positioned to receive said generated noise energy, comprising the steps of:

intercepting said generated noise energy by a plenum positioned along a transfer path extending longitudinally between said noise generating apparatus and said compartment;

mounting a counter energy generating device along said transfer path within said plenum;

creating a counter noise energy by said counter energy generating device positioned within said plenum to counteract said generated noise energy along said transfer path before reaching said compartment.

14. The method of claim 13 wherein said intercepting step further includes the step of positioning sensors proximate to said noise generating apparatus to identify parameters of said generated noise energy, said creating step including the step of:

processing signals from said sensors indicative of said parameters by a controller operable to develop a noise control signal and send said noise control signal to said counter energy generating device to create said counter noise energy.

15. The method of claim 14 wherein said counter energy generating device is a speaker operable to create a counter sound wave, said generated noise energy including a generated sound wave having an amplitude and a frequency, said creating step generating said counter sound wave having a counter amplitude and a counter frequency to counteract said generated sound wave.

16. The method of claim 14 wherein said counter energy generating device is a vibration generator operable to create a counter vibrational energy, said generated noise energy including a generated vibrational energy having an amplitude and a frequency, said creating step generating said counter vibrational energy having a counter amplitude and a counter frequency to counteract said generated vibrational energy.

17. The method of claim 13 wherein said plenum is formed with a pair of longitudinally spaced bulkheads and is connected to an instrument panel in an automotive vehicle positioned at a forward location in a passenger compartment of said vehicle, further comprising the step of:

affixing passive sound control materials to walls defining said plenum.

* * * * *